United States Patent
Jasniewicz et al.

(10) Patent No.: US 7,898,342 B2
(45) Date of Patent: Mar. 1, 2011

(54) CIRCUIT FOR CLOCK INTERPOLATION AND METHOD FOR PERFORMING CLOCK INTERPOLATION

(75) Inventors: Boris Jasniewicz, Heidelberg (DE); Hartmut Keyl, Sandhausen (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 1063 days.

(21) Appl. No.: 10/980,027

(22) Filed: Nov. 3, 2004

(65) Prior Publication Data

US 2005/0093636 A1    May 5, 2005

(30) Foreign Application Priority Data

Nov. 3, 2003    (DE) .................................. 103 51 218

(51) Int. Cl.
*H03L 7/06*    (2006.01)
(52) U.S. Cl. .................................. 331/2; 331/16; 331/56
(58) Field of Classification Search ................ 331/2, 16, 331/46, 48, 55, 59, 56
See application file for complete search history.

(56) References Cited

U.S. PATENT DOCUMENTS

| | | | | |
|---|---|---|---|---|
| 4,365,276 A | * | 12/1982 | Kokaji et al. ................. | 358/301 |
| 5,347,361 A | | 9/1994 | Kay | |
| 5,471,652 A | * | 11/1995 | Hulkko ........................... | 455/76 |
| 5,955,902 A | | 9/1999 | Takada et al. | |
| 6,028,488 A | * | 2/2000 | Landman et al. .............. | 331/1 A |
| 6,057,715 A | | 5/2000 | Kawasaki | |
| 6,147,525 A | | 11/2000 | Mitani et al. | |
| 6,763,474 B1 | * | 7/2004 | Boerstler et al. .............. | 713/400 |

FOREIGN PATENT DOCUMENTS

| | | |
|---|---|---|
| AT | 004 985 U1 | 12/2001 |
| DE | 197 43 943 A1 | 4/1999 |
| EP | 0 635 116 B1 | 1/1995 |
| JP | 1144818 A | 6/1989 |
| JP | 1151316 A | 6/1989 |
| JP | 9083352 A | 3/1997 |
| JP | 9270680 A | 10/1997 |
| JP | 11046137 A | 2/1999 |
| JP | 2000148281 A | 5/2000 |
| JP | 2001091595 A | 4/2001 |
| JP | 2003186940 A | 7/2003 |

OTHER PUBLICATIONS

Japanese Office Action dated Jan. 5, 2010.

* cited by examiner

*Primary Examiner* — Robert Pascal
*Assistant Examiner* — Levi Gannon
(74) *Attorney, Agent, or Firm* — Laurence A. Greenberg; Werner H. Stemer; Ralph E. Locher

(57) ABSTRACT

In a circuit and a method of clock interpolation, an input signal at a first frequency is processed and at least one output signal having a second frequency being a multiple of the first frequency of the input signal is output. The circuit is defined by the fact that the input signal is measured with respect to frequency and phase in a PLL frequency measuring circuit, and by the fact that the measured input signal is multiplied by at least one frequency multiplier and an oscillator that follows the frequency multiplier.

16 Claims, 3 Drawing Sheets

CIRCUIT FOR CLOCK INTERPOLATION AND METHOD FOR PERFORMING CLOCK INTERPOLATION

BACKGROUND OF THE INVENTION

Field of the Invention

The present invention relates to a circuit and a method for processing an input signal at a first frequency and outputting at least one output signal whose frequency is a multiple of the first frequency of the input signal.

Nowadays, because of the high accuracy requirements, controlling presses without using rotary encoders on rotating components of these machines is inconceivable. In particular in the case of presses without continuous mechanical drive connections between individual printing units of individual drive construction, it is necessary to provide all the individually driven press cylinders with rotary encoders in order to be able to operate the printing units, which are not coupled mechanically to one another, with accurate register. In this case, rotary encoders register the rotational angle plotted against time of a rotating component, such as a press cylinder, in order to convert the rotational angle into an electrical signal that can be supplied to a control system of the press. However, in the meantime, the rotary encoders are needed not only for the synchronization of press cylinders but also for the control of the image setting operation in plate exposers and in what are known as DI presses, that is to say offset presses in which the plate cylinder is inscribed in the machine, for example by a laser, and is therefore imaged. In order to be able to perform the imaging sufficiently precisely, the signal from the rotary encoder used on the rotating plate cylinder must have a high resolution.

In rotary encoders, a distinction must in principle be drawn between physical resolution and interpolated resolution. If a rotary encoder has a subdivision of, for example, 360 steps over one revolution, this corresponds to its physical resolution. The signal can be converted by interpolation in an electronic circuit into a more highly resolved format, errors typically occurring in this case. With regard to angular interpolation, a number of possibilities are known from the prior art. One solution known from drive technology to the problem of producing high-resolution rotational angle information is the use of rotary encoders having sine/cosine output signals, from which the instantaneous angle is calculated with the aid of an arc tangent method. In order to achieve the desired high resolution with sine/cosine rotary encoders, the latter have to operate with very high physical numbers of divisions, since interpolation factors of greater than 100 are very difficult to implement with such methods. This is very complicated in constructional terms and therefore correspondingly expensive. The interpolation methods therefore frequently used to increase the resolution in these rotary encoders either do not permit any variations or only very coarse variations in the interpolation factor used, the latter normally being only integral. In the case of imaging a plate cylinder in the press, however, clock signals have to be produced at determined angular positions, which requires rational interpolation factors that are also variable.

A further possibility known from the prior art for generating highly resolved, angularly synchronized clock signals is the use of a digital incremental encoder with a binary output signal, also called a TTL rotary encoder, TTL standing for "transistor logic", attached to what is known as a phase control loop (PLL), such as is used, for example, for the frequency multiplication of binary clock signals. The term PLL stands for "phase locked loop", a control loop whose output signal is readjusted to equal the phase of the input signal. In this case, it is possible to generate an output clock signal whose frequency is any desired multiple of the frequency of the binary output signal from the rotary encoder, without the phase information being lost in the process. If rational multiples of the frequency of the binary output signal of the rotary encoder are required, in this case, a technique is applied which is known under the name "fractional N". In this case, in the feedback branch of the phase control loop there is a programmable frequency divider, which permits variation of the divider ratio over time. As a result of the variation of the divider ratio over time, the input frequency of the phase control loop can be multiplied in rational factors around the time average, although the phase control loop can in principle only divide by whole numbers. For example, if the output signal is to be higher by the factor 10.5, then the divider ratio of the frequency divider must each case be varied alternately between 10 and 11, so that the result averaged over time is a factor of 10.5. In the "fractional N" technique, in particular the production of a systematic error induced by the principle is disadvantageous, since the variation in the divider ratios of the programmable divider produces disturbances in the phase control loop at the output from the phase detector.

A similar approach follows a method for frequency multiplication in which the output clock from a rotary encoder is measured over one period and the multiplied frequency of the output clock is then calculated. In order to couple the output clock to the input clock in the correct phase, a phase control loop is also used here, the phase control loop being constructed for the direct control of the frequency of the input signal, in order to perform continuous correction of the phase error in the output signal. This method is described extensively in Austrian utility model specification AT 004 985 U1.

From the area of press construction, Published, Non-Prosecuted German Patent Application DE 197 43 943 A1 discloses a possible way of multiplying the frequency of the binary clock signal of a TTL rotary encoder, in which an output clock signal at a multiple of the input signal is generated by a normal PLL frequency multiplier circuit. The output signal from the frequency multiplier circuit represents the supply clock signal of what is known as a DDS frequency generator, DDS standing for "direct digital synthesis". However, this configuration has the disadvantage that, in the case of such a normal phase control loop, the generation of the supply clock for the DDS frequency generator functions only in a very limited frequency range.

SUMMARY OF THE INVENTION

It is accordingly an object of the invention to provide a circuit for clock interpolation and method for performing clock interpolation which overcome the above-mentioned disadvantages of the prior art devices and methods of this general type, which generates a high-resolution output signal interpolated from an oscillating signal.

By the circuit according to the invention and the method according to the invention, it is simply possible to multiply an oscillating signal having a specific frequency. Here, the circuit can be constructed both using analog technology and using digital technology.

With the foregoing and other objects in view there is provided, in accordance with the invention, a circuit for processing an input signal at a first frequency and for outputting at least one output signal having a second frequency being a multiple of the first frequency of the input signal. The circuit contains a PLL frequency measuring circuit for measuring the input signal with respect to frequency and phase. The PLL frequency measuring circuit outputs a measured input signal. A frequency multiplier is connected to the PLL frequency measuring circuit and receives and multiplies the measured input signal. The frequency multiplier outputs a multiplied input signal and an oscillator is disposed downstream of the frequency multiplier.

In a first configuration of the invention, the circuit is constructed digitally. The digital structure makes use of the property of a phase control loop (PLL) that the latter can measure the frequency of the input signal. Here, as long as the phase control loop operates in the latched state, no phase information is lost, so that the output signal from the phase control loop is proportional to the frequency of the input signal and has the same phase. Furthermore, the output signal from the phase control loop is multiplied by the frequency multiplier and passed on to the input of an oscillator, whose output signal then has the frequency of the desired output clock. In such a system, the phase of the output clock is no longer under closed-loop control but only open-loop control, for which reason the method must be implemented in a completely digital system. The great advantage of the invention resides in the fact that, in this case, no additional implementation effort has to be expended in order to correct a systematic error, as in the case of the "fractional N" technique, and that, on the other hand, the desired high resolution of a rotary encoder can be achieved. Additionally, during the imaging of press cylinders at determined angular positions, appropriate clock signals can be output. Furthermore, a digital circuit offers the advantage that a great frequency range can be covered and that the circuit can be configured flexibly, by appropriate digital components being programmed in a simple manner.

In a further configuration of the invention, provision is made for the PLL frequency measuring circuit to be coupled via a frequency multiplier to the input of a digital oscillator and for its output signal to be the output signal from the digital circuit. As already mentioned, a circuit according to the invention can be implemented only in completely digital technology, since the oscillator of the phase control loop has to be synchronized to a further oscillator, which is only possible under open-loop control, following the frequency multiplication. For this reason, it is necessary for the oscillator at the output of the frequency multiplier also to be a digital oscillator.

In this case, it is additionally advantageous that a digital oscillator present in the PLL frequency measuring circuit and a digital oscillator linked to the PLL frequency measuring circuit via a frequency multiplier can be driven with the same system clock signal. The two digital oscillators can operate synchronously only if they are supplied with the same system clock. Only by the completely digital construction of the system is it possible to use this same system clock in both oscillators.

In a further advantageous refinement of the invention, provision is made for the input signal of the digital circuit to be the digital output signal from a two-channel rotary encoder. In the case of two-channel rotary encoders, the two output channels run with a phase offset of 90 degrees in relation to each other. The digital incremental encoder cannot resolve a revolution unambiguously. Only absolute encoders are able to do this. The digital output signal from the two-channel rotary encoder can then be used for processing in the digital circuit. In this case, recourse can be had to normal commercially available digital incremental encoders with a resolution that is not particularly high, which reduces the costs considerably.

Furthermore, provision is advantageously made for the PLL frequency measurement circuit to be linked via two or more frequency multipliers to the inputs of two or more associated digital oscillators, and for their output clock signals to be the output signals from the circuit. It is therefore possible to provide in parallel output signals of different frequency which are phase-coupled to a common input signal. In this case, all the linked digital oscillators are linked to the system clock.

In addition, provision is made for the digital circuit to be implemented by a programmable logic module. Such a system is a programmable logic module such as, for example, a CPLD (complex programmable logic device) or an FPGA (field programmable gate array).

Alternatively, provision is additionally made for the digital circuit to be implemented as a signal processor. As opposed to a logic module, a signal processor is configured for specific tasks in the area of digital signal processing.

Alternatively or in addition to the DSP or logic module, use can also be made of an ASIC. An ASIC (application-specific integrated circuit) is prepared for a specific intended use and is therefore a very specialized component. However, it is also possible for part of the digital circuit to be implemented in a programmable logic module and for another part of the digital circuit to be implemented in a signal processor or an ASIC. In this way, the advantages of the individual digital components can be combined with one another.

Provision is advantageously made for the frequency multiplier to be multiplied by a rational interpolation factor. As a result of using rational interpolation factors, the resolution of the angular signals from the rotary encoder can be determined largely continuously, since only the binary quantization limits the resolution. Only by use of the continuously variable configuration of the resolution is it possible to generate clock signals at determined angular positions which correspond to non-integer multiples of the physical resolution. Since this is required, for example, when imaging plate cylinders in presses, the invention is particularly suitable for processing angular signals from rotary encoders in presses or other machines that process print materials.

Other features which are considered as characteristic for the invention are set forth in the appended claims.

Although the invention is illustrated and described herein as embodied in a circuit for clock interpolation and a method for performing clock interpolation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
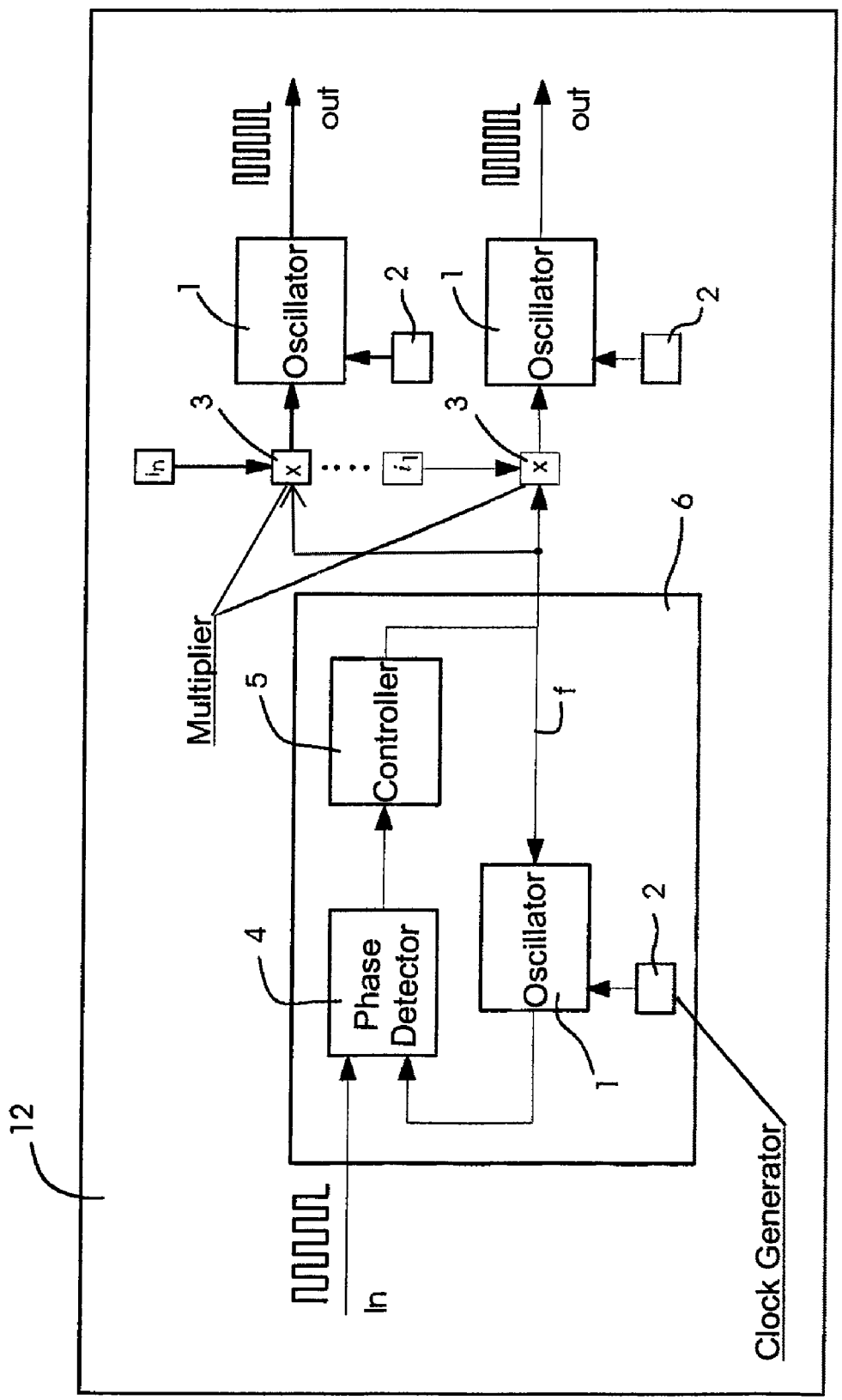
FIG. 1 is a block circuit diagram of a circuit having a phase control loop, a downstream frequency multiplier and a controlled digital oscillator according to the invention.

Referring now to the figures of the drawing in detail and first, particularly, to FIG. 1 thereof, there is shown a basic structure of a digital circuit according to the invention when used in a press 12. The digital circuit contains a PLL frequency measuring circuit 6 which, as input signal In, receives an output signal from a rotary encoder and outputs a signal f whose phase is coupled with the input signal In. The PLL frequency measuring circuit 6 contains a phase detector 4 for determining a phase difference between the input signal In and the signal that is output from a digital oscillator 1. A controller 5 is connected to the phase detector 4. The regulated signal f is applied to a feedback branch that has the digital oscillator 1. The value of the signal f, which is measured by the PLL frequency measuring circuit 6 without frequency multiplication and is then multiplied by an arbitrary interpolation factor $i_1$ in a frequency multiplier 3, is applied to the input of a second digital oscillator 1, which generates an output signal Out. Since, in this period, the phase of the output signal Out is no longer under closed-loop control but only under open-loop control, it can be implemented only as a completely digital system. The phases of the two clocks of the controlled digital oscillators 1 are synchronized with each other by being supplied with the same system clock 2, which is indicated symbolically in the block diagram in FIG. 1 by the small blocks 2. In this case, a plurality of frequency multipliers 3 and digital oscillators 1 can be connected to the PLL frequency measuring circuit 6, so that, given different interpolation factors $i_1$ to $i_n$, output signals Out with different frequencies can be output. These output signals Out are available in parallel and are all phase-coupled to the input signal In.

The question arises as to why the measurement of the frequency of the input signal In is not carried out directly, for example with the aid of a microcontroller. The reason for this is the phase-controlled measurement of the frequency by the PLL frequency measuring circuit 6. Because of the integral relationship between frequency and phase, in the case of a simple frequency measurement, errors such as the quantization noise of the digital multiplication or of the time quantization of the input signal add up in an uncontrolled manner, that is to say the information about the rotational angle of a rotating component on the press 12 is lost. As opposed to this, a PLL frequency measuring circuit 6 measures the frequency of the input signal In without any loss of the phase information since, as long as the PLL frequency measuring circuit 6 operates in the latched state, the phase is always captured again. The measured frequency is composed of an actual component $f_{in}(t)$ and an error component $f_e(t)$, so that, for a frequency $f_{out}(t)$ of the output signal, it is true that $$f_{out}(t) = i \cdot f_m(t)$$
$$= i \cdot (f_{in}(t) + f_e(t))$$

and, respectively, following the integration, for its phase, it is true that $$\varphi_{out}(t) = i \cdot \int_0^t 2\pi f_{in}(\tau)d\tau + i \cdot \int_0^t 2\pi f_e(\tau)d\tau$$
$$= i \cdot \varphi_{in}(t) + i \cdot \varphi_e(t)$$

The PLL frequency measuring circuit 6 now ensures that $f_e(t)$ does not contain any DC component and $\varphi_e(t)$ remains within limits that can be estimated. In the case of simple frequency management, the phase control would be omitted and the error would not be limited. The frequency measuring property of a PLL frequency measuring circuit 6 can therefore be used directly for the purpose of generating a clock signal Out whose frequency is a rational multiple i of the frequency of a first clock signal In and whose phase is coupled to the phase of the first clock signal In.

Figure 3:
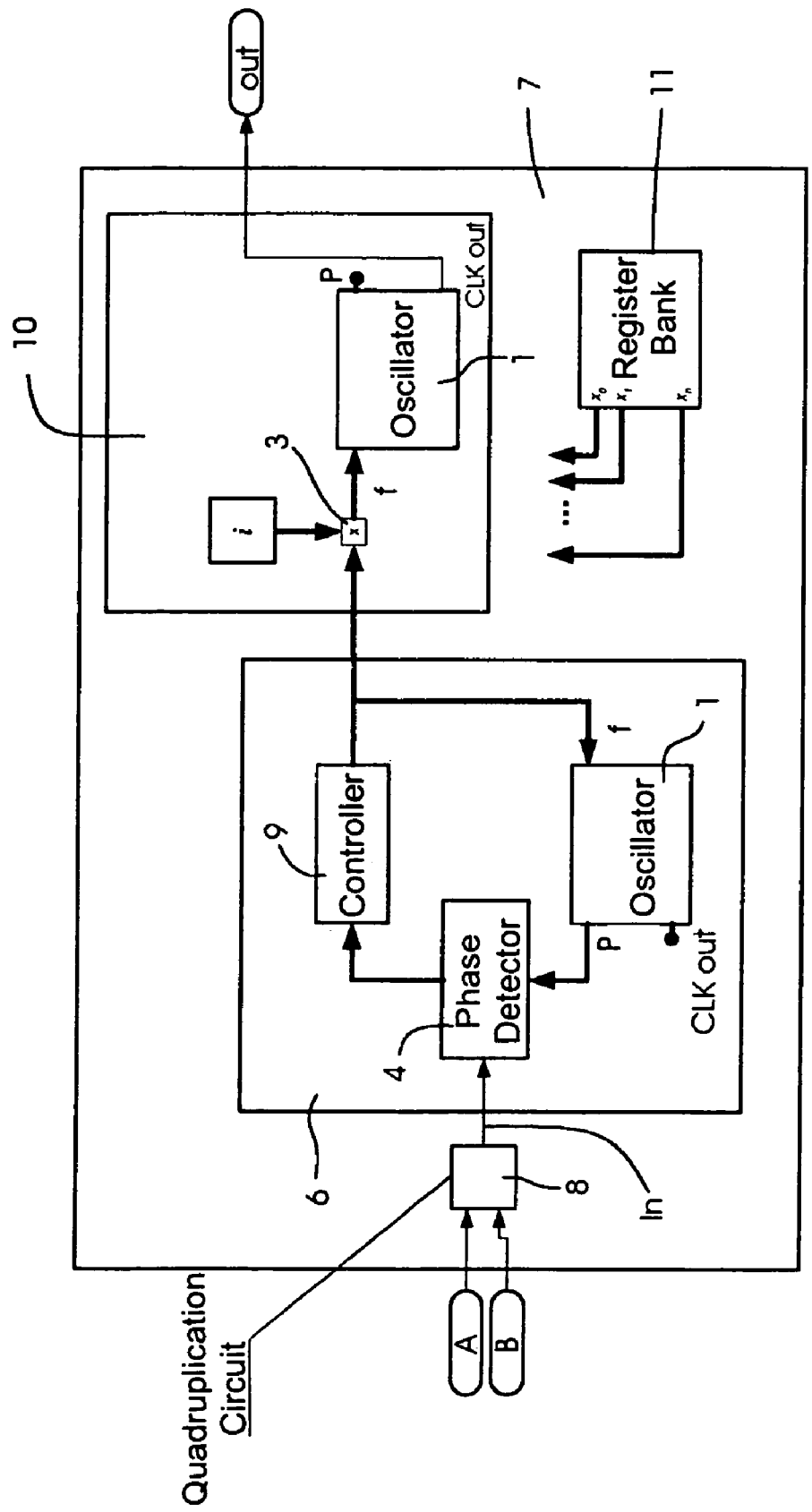
FIG. 3 is a block circuit diagram of an implementation of the circuit according to the invention on a programmable logic module.

According to FIG. 3, the completely digital system from FIG. 1 is implemented in a programmable logic module 7. It is also possible to implement the system within a signal processor or to mix the two variants and to divide up the various components to programmable logic modules 7 and signal processors. In FIG. 3, two channels A, B of a non-illustrated rotary encoder arrive on the left. The two signals are phase-shifted electrically by 90°. A quadruplication circuit 8 evaluates falling and rising edges of the two channels A and B. The signal generated in this way forms the input signal In for the PLL frequency measuring circuit 6, which measures the frequency of the input signal In. The PLL frequency measuring circuit 6 is followed by the actual clock generating circuit 10, in which the measured value f supplied by the PLL frequency measuring circuit 6, scaled with an appropriate interpolation factor i by a frequency multiplier 3, is passed to the input of a digital oscillator 1, which generates the output signal Out as the useful clock CLK out. Readable and writable parameters of the entire circuit are located in a register bank 11 of the logic module 7, so that the circuit can be used universally.

Figure 2:
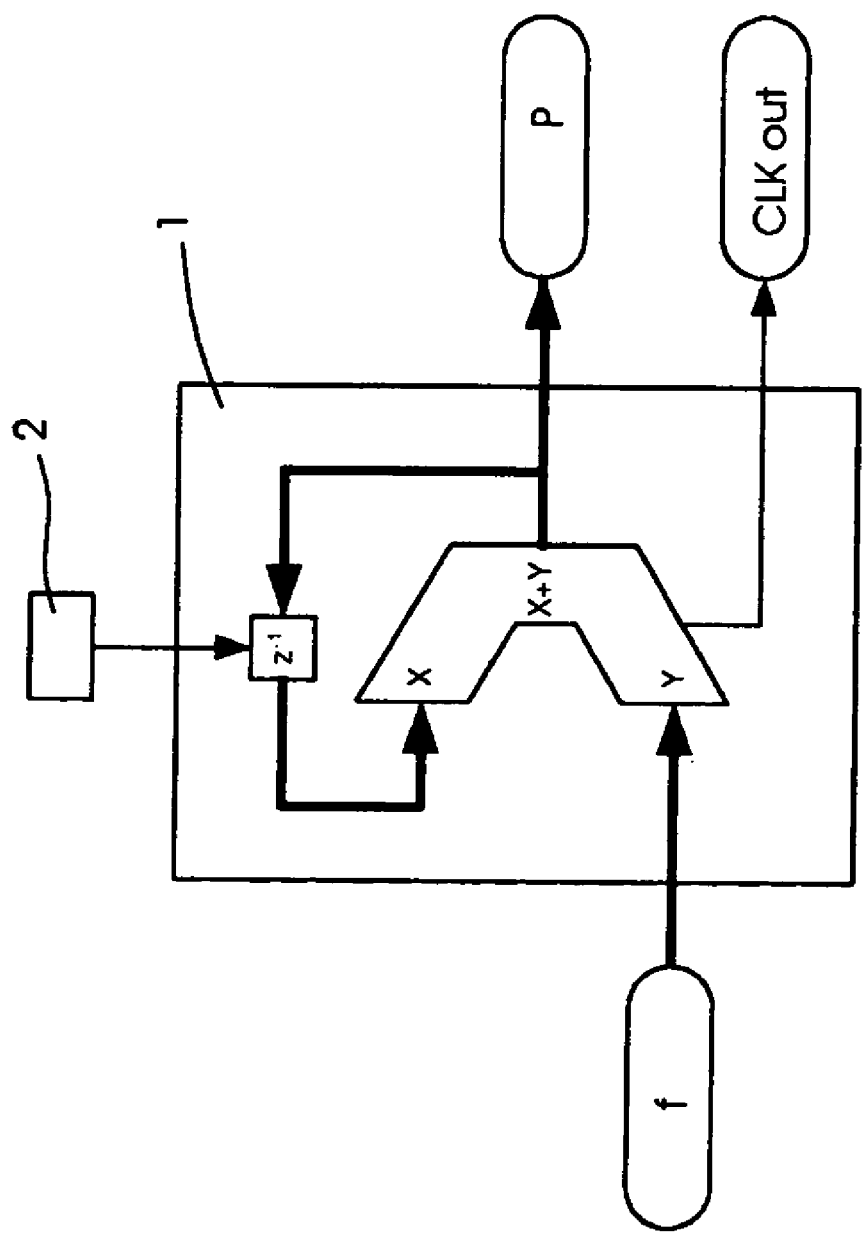
FIG. 2 is a block diagram of a digital oscillator.

A block diagram of the digital oscillator 1 can be seen in FIG. 2, the downstream oscillator 1 of the PLL frequency measuring circuit 6 and the oscillator 1 in the clock generating circuit 10 both being constructed as simple phase accumulators in each case. In such accumulators, for example a binary word $f_w$, that represents the frequency f of the oscillator 1, is accumulated (added) with a system clock 2, here $f_{clk}$. As the clock output CLK out, the circuit uses the overflow bit of the accumulator or adder. The frequency $f_{osc}$ of the output signal CLK out is then $$f_{osc} = \frac{f_w}{2^n} \cdot f_{clk}.$$

In addition, there is an output P, on which the current value of the phase accumulator is present. This permits a simple implementation of the phase detection function by circuitry, described in the following text. The sampling of the phase signal P of the downstream oscillator 1 by use of the input signal of the PLL frequency measuring circuit 6 represents the phase detector 4 which measures the phase shift between the input clock In of the PLL frequency measuring circuit 6 and the output clock CLK out of a downstream controlled oscillator 1: the input pulses write the content of the phase accumulator into a register belonging to the logic module 7. The register content represents the twos complement of the phase shift between the input signal In and the output signal CLK out of the downstream oscillator 1.

In this case, a controller 9 is implemented as a digital arithmetic circuit, for example as a digital PI controller 9. The frequency multiplier 3, which scales the frequency word of the downstream oscillator 1 of the PLL frequency measuring S circuit 6 with the interpolation factor i, represents the actual angular interpolation: here, the frequency f of the input signal In is multiplied. The implementation of the scaling operation is carried out as an n×n-bit multiplication.

This application claims the priority, under 35 U.S.C. § 119, of German patent application No. 103 51 218.7, filed Nov. 3, 2003; the entire disclosure of the prior application is herewith incorporated by reference.

We claim:

1. A circuit for processing an input signal at a first frequency and for outputting at least one output signal having a second frequency being a multiple of the first frequency of the input signal, the circuit comprising:
   a digital PLL frequency measuring circuit for measuring the input signal with respect to frequency and phase, said PLL frequency measuring circuit outputting a measured input signal;
   a digital multiplier connected to said PLL frequency measuring circuit receiving and multiplying the measured input signal, said multiplier outputting a multiplied input signal; and
   a digital oscillator disposed downstream of said multiplier, said oscillator being under open-loop control having no closed loop control circuit;
   wherein the circuit is constructed digitally.

2. The circuit according to claim 1, wherein the multiplied input signal can be output as the output signal and has a same phase as the input signal.

3. The circuit according to claim 1, wherein the input signal is a rotational angle input signal from a rotary encoder and the output signal has many times a resolution of the rotational angle input signal.

4. The circuit according to claim 3, wherein a digital output signal from a two-channel rotary encoder is used as the rotational angle input signal.

5. The circuit according to claim 1, wherein:
   said oscillator is a digital oscillator having an input; and
   said PLL frequency measuring circuit is coupled to said input of said digital oscillator through said multiplier, said digital oscillator outputs an output clock signal being the output signal of the circuit.

6. The circuit according to claim 5, further comprising a system clock generator outputting a system clock signal, said PLL frequency measuring circuit having a further digital oscillator, and said digital oscillator and said further digital oscillator are both coupled to said system clock generator and driven by the system clock signal.

7. The circuit according to claim 1, wherein:
   said multiplier is one of at least two multipliers;
   said oscillator is one of at least two digital oscillators having inputs;
   said PLL frequency measuring circuit is coupled through said two multipliers to said inputs of said two digital oscillators; and
   said two digital oscillators outputting output clock signals being the output signal of the circuit.

8. The circuit according to claim 1, wherein the circuit is a programmable logic module.

9. The circuit according to claim 1, wherein the circuit is a signal processor.

10. The circuit according to claim 1, wherein the circuit is an application specific integrated circuit.

11. The circuit according to claim 1, wherein:
   the circuit is formed of a first part and a second part, the first part being selected from the group consisting of programmable logic modules, application specific integrated modules and signal processors;
   said second part selected the group consisting of programmable logic modules, application specific integrated modules and signal processors; and
   said first part and said second part are not the same.

12. The circuit according to claim 1, wherein said multiplier has a rational interpolation factor.

13. A machine for processing print material, the machine comprising:
   a circuit receiving and processing an input signal at a first frequency and outputting at least one output signal having a second frequency being a multiple of the first frequency of the input signal, the circuit containing:
      a digital PLL frequency measuring circuit for measuring the input signal with respect to frequency and phase, said PLL frequency measuring circuit outputting a measured input signal;
      a digital multiplier connected to said PLL frequency measuring circuit receiving and multiplying the measured input signal, said multiplier outputting a multiplied input signal; and
      a digital oscillator disposed downstream of said multiplier, said oscillator being under open-loop control having no closed loop control circuit;
   wherein the circuit is a digital circuit.

14. A method for digitally processing an input signal at a first frequency and for outputting at least one output signal having a second frequency being a multiple of the first frequency of the input signal, which comprises the steps of:
   measuring the input signal with respect to frequency and phase in a digital PLL frequency measuring circuit resulting in a measured input signal; and
   multiplying the measured input signal by means of at least one digital multiplier and a digital oscillator that is under open-loop control, that has no closed loop control circuit, and that is disposed downstream of the multiplier.

15. The method according to claim 14, which further comprises outputting a multiplied input signal as the output signal having a same phase as the input signal by means of digital signal processing.

16. The method according to claim 15, which further comprises processing a rotational angle input signal from a rotary encoder as the input signal.

* * * * *